United States Patent
Fertig et al.

(10) Patent No.: US 11,811,456 B2
(45) Date of Patent: Nov. 7, 2023

(54) MULTI-PIXEL WAVEGUIDE OPTICAL RECEIVER

(71) Applicant: Honeywell International Inc., Charlotte, NC (US)

(72) Inventors: Chad Fertig, Bloomington, MN (US); Matthew Wade Puckett, Phoenix, AZ (US)

(73) Assignee: Honeywell International Inc., Charlotte, NC (US)

( * ) Notice: Subject to any disclaimer, the term of this patent is extended or adjusted under 35 U.S.C. 154(b) by 72 days.

(21) Appl. No.: 17/217,628

(22) Filed: Mar. 30, 2021

(65) Prior Publication Data

US 2022/0321228 A1 Oct. 6, 2022

(51) Int. Cl.
*H04B 10/50* (2013.01)
*G02B 6/12* (2006.01)
*G02B 6/42* (2006.01)
*H01S 5/026* (2006.01)

(52) U.S. Cl.
CPC ....... *H04B 10/503* (2013.01); *G02B 6/12007* (2013.01); *G02B 6/4246* (2013.01); *H01S 5/0262* (2013.01)

(58) Field of Classification Search
CPC .... H04B 10/503; H04B 10/40; H04B 10/112; H04B 10/60; H04B 17/336; H04B 10/43; H04B 10/501; H04B 10/50; H04B 10/502; H04B 10/506; H04B 10/70;
(Continued)

(56) References Cited

U.S. PATENT DOCUMENTS 10,578,722 B2 3/2020 Wu et al.
10,732,266 B2 8/2020 Popovich et al.
(Continued)

FOREIGN PATENT DOCUMENTS

KR 20190117418 A 10/2019

OTHER PUBLICATIONS

European Patent Office, "Extended European Search Report from EP Application No. 22161421.7", from Foreign Counterpart to U.S. Appl. No. 17/217,628, filed Aug. 2, 2022, pp. 1 through 8, Published: EP.
(Continued)

*Primary Examiner* — Hibret A Woldekidan
(74) *Attorney, Agent, or Firm* — Fogg & Powers LLC

(57) ABSTRACT

Systems and embodiments for a multi-pixel waveguide optical receiver are described herein. In certain embodiments, a system includes an emitter that emits laser light towards a surface. The system also includes a receiver that passively receives reflected laser light that is a portion of the laser light reflected from the surface, wherein the receiver has multiple pixels having a size that is smaller than an expected optical speckle size, wherein the expected optical speckle size corresponds to a region on the receiver where the reflected laser light has a substantially uniform spatial phase. Additionally, the system includes a combiner configured to combine optical fields from each pixel in the multiple pixels into an output that supports a number of modes that is equal to a number of pixels in the multiple pixels. Moreover, the system includes a photodetector configured to receive light from the output.

16 Claims, 6 Drawing Sheets

(58) Field of Classification Search
CPC . G02B 6/12007; G02B 6/4246; H01S 5/0262; H04J 14/02; H04J 14/04; H04J 14/00
USPC .................. 398/138, 135, 164, 79, 84, 87
See application file for complete search history.

(56) References Cited

U.S. PATENT DOCUMENTS

| | | | |
|---|---|---|---|
| 2012/0226118 A1* | 9/2012 | Delbeke | A61B 5/0031 600/316 |
| 2014/0209798 A1 | 7/2014 | Woodward et al. | |
| 2016/0139336 A1* | 5/2016 | Bansal | H01S 3/094053 65/36 |
| 2018/0275254 A1* | 9/2018 | Wu | G01S 7/4816 |
| 2019/0025431 A1* | 1/2019 | Satyan | G01S 7/4914 |
| 2020/0284883 A1 | 9/2020 | Ferreira et al. | |
| 2020/0284908 A1 | 9/2020 | Paulsen | |

OTHER PUBLICATIONS

Kim, "Realization of Integrated Coherent LiDAR", Technical Report No. UCB/EECS-2020-38, A dissertation submitted in partial satisfaction of the requirements for the degree of Doctor of Philosophy, Electrical Engineering and Computer Sciences, May 1, 2020, pp. 1 through 133, University of California Berkeley.

O'Brien et al., "Simulation of 3D Laser Radar Systems", Lincoln Laboratory Journal, 2005, pp. 37 through 60, vol. 15, No. 1.

Puckett, Matthew W. et al., "Device for Emission of Arbitrary Optical Beam Profiles From a Chip to Free Space", U.S. Appl. No. 16/800,877, filed Feb. 25, 2020, pp. 1 through 33, Published: US.

Puckett, Matthew W. et al., "Device for the Emission of Arbitrary Optical Beam Profiles From Waveguides Into Two-Dimensional Space", U.S. Appl. No. 16/803,712, filed Feb. 27, 2020, pp. 1 through 20, Published: US.

Tin, Steven et al., "High Resolution and High Efficiency Photonic Air Data Detection", U.S. Appl. No. 16/569,555, filed Sep. 12, 2019, pp. 1 through 34, Published: US.

Tin, Steven et al., "High Temperature and High Dynamic Bandwidth Photonic Sensor for Gas Flow Rate, Temperature, and Pressure Measurement", U.S. Appl. No. 16/569,581, filed Sep. 12, 2019, pp. 1 through 34, Published: US.

Tin, Steven et al., "Silicon Photonics Integrated Optical Velocimeter", U.S. Appl. No. 16/784,111, filed Feb. 6, 2020, pp. 1 through 35, Published: US.

Puckett, Matthew W. et al., "Integrated Photonics Air Data System", U.S. Appl. No. 17/080,102, filed Oct. 26, 2020, pp. 1 through 32, Published: US.

* cited by examiner

MULTI-PIXEL WAVEGUIDE OPTICAL RECEIVER

BACKGROUND

Many systems benefit from the capabilities of lidar systems. For example, lidar systems may be essential components of air data systems. Lidar systems may be installed on vehicles (such as aircraft) and ground-based systems. The lidar systems may provide ranging information to larger systems that calculate navigation solutions. Some lidar systems are made using integrated photonics to provide compact; robust; low cost; and low size, weight, and power (SWaP) components in alternative or augmented navigation systems.

Typically, lidar systems emit light towards a target that scatters some of the light incident on the target. The lidar system may receive a portion of the scattered light having spatial phase variations associated with variations on the surface of the target. These spatial phase variations are commonly known as laser speckles.

SUMMARY

Systems and embodiments for a multi-pixel waveguide optical receiver are described herein. In certain embodiments, a system includes an emitter that emits laser light towards a surface. The system also includes a receiver that passively receives reflected laser light that is a portion of the laser light reflected from the surface, wherein the receiver has multiple pixels having a size that is smaller than an expected optical speckle size, wherein the expected optical speckle size corresponds to a region on the receiver where the reflected laser light has a substantially uniform spatial phase. Additionally, the system includes a combiner configured to combine optical fields from each pixel in the multiple pixels into an output that supports a number of modes that is equal to a number of pixels in the multiple pixels. Moreover, the system includes a photodetector configured to receive light from the output.

DRAWINGS

Drawings accompany this description and depict only some embodiments associated with the scope of the appended claims. Thus, the described and depicted embodiments should not be considered limiting in scope. The accompanying drawings and specification describe the exemplary embodiments, and features thereof, with additional specificity and detail, in which:

Figure 1:
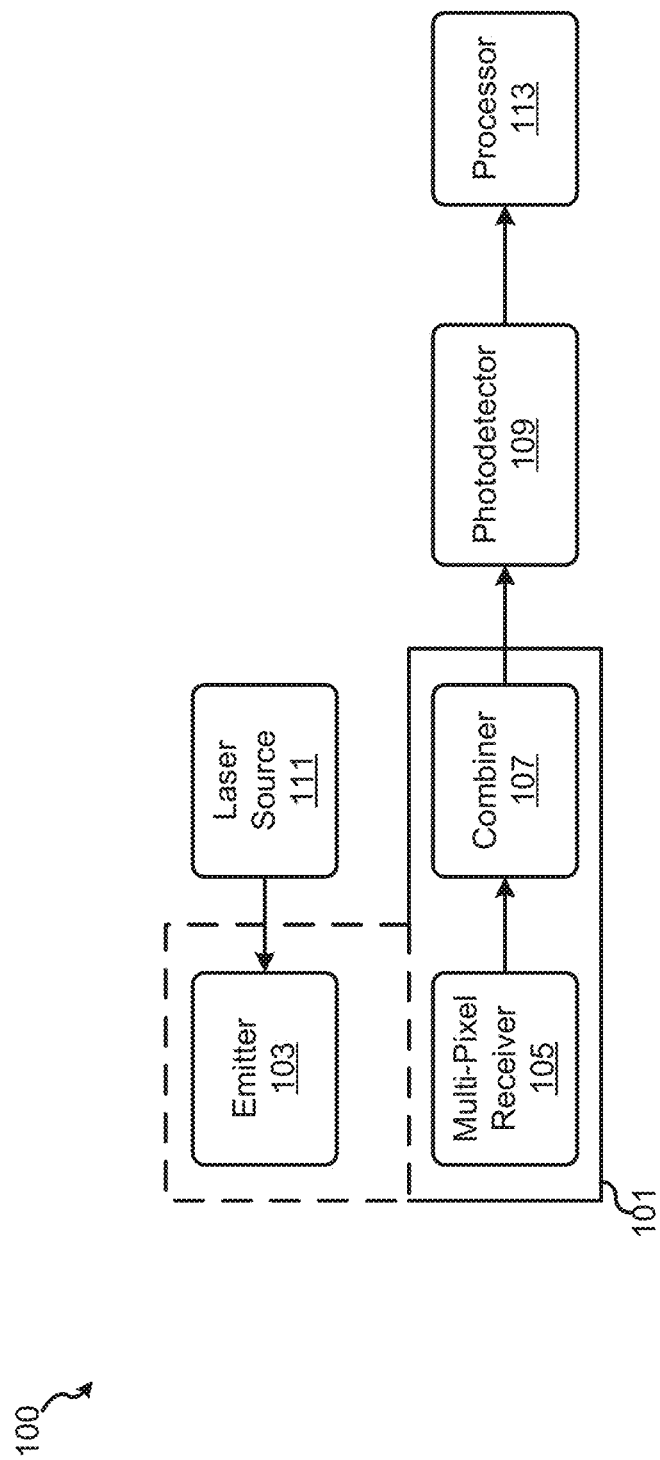
FIG. 1 is a block diagram of a lidar system that includes a multi-pixel waveguide optical receiver according to an aspect of the present disclosure.

Per common practice, the drawings do not depict the various described features according to scale. Rather, the drawings depict the described features to emphasize the relevance of the features to exemplary embodiments.

DETAILED DESCRIPTION

The following detailed description refers to the accompanying drawings that form a part of the present description, which drawings show, through illustration, specific illustrative embodiments. However, it is to be understood that other embodiments may be used and that logical, mechanical, and electrical changes may be made.

The present application describes systems and methods for a multi-pixel waveguide optical receiver. In typical lidar systems, an optical transceiver may emit light toward a surface. The surface may frequently scatter the emitted light in many directions. Some scattered light may return to an optical receiver that is part of the lidar system. The optical receiver provides the received light to a photodetector through an optical transmission medium like an optical waveguide. The photodetector converts incident light into electrical signals. A processor (or processors) may execute instructions that cause the processor to provide ranging or other useful information acquired from the electrical signals.

In some systems, the spatial phase of the scattered light received by the optical receiver may vary across the receiving area of the optical receiver. In some systems, because of varying spatial phase, when the optical receiver couples the light into the optical transmission media, the coupled light may destructively interfere with itself as the light propagates through the optical transmission media. The destructive interference causes a loss of information in the received light, affecting measurements produced from the received light.

This application describes exemplary embodiments of a multi-pixel optical receiver that provides signals to a combiner, where the combiner transmits the received light to a photodetector. The optical receiver and the combiner function together to limit destructive interference when providing the received light to the photodetector. The processor may accordingly process electrical signals from the photodetector that more accurately represent the light incident on the optical receiver.

The multi-pixel optical receiver limits destructive interference by having multiple pixels, where the pixel size is smaller than an expected optical speckle size, where the expected optical speckle size corresponds to a region on the multi-pixel optical receiver where the reflected laser light is substantially uniform in phase. The substantial uniformity of the spatial phase across a pixel reduces destructive interference of the light from that pixel when coupled into a waveguide. The combiner combines the light from the different pixels of the optical receiver even when the phase of the light coupled from different pixels is substantially random in phase by combining it into multiple modes of the multimode waveguide. The combining of multiple pixels into multiple modes of a waveguide reduces destructive interference of the received light.

FIG. 1 is a block diagram of a system 100 for transmitting and receiving light. The system 100 may be a lidar system and may include a multi-pixel receiver 105 and a combiner 107 to limit destructive interference of the received light from different pixels when combined into a single transmission waveguide. The system 100 may include a laser source 111 that produces laser light. The laser source 111 emits laser light at a selected wavelength and may be a pulsed laser, a vertical-cavity surface emitting laser, or other type of laser source. The laser source 111 may be fabricated as part of an integrated photonics chip with other components in the system 100 or may be located off of the integrated photonics chip as a separate component of the system 100.

In exemplary embodiments, the system 100 may include an emitter 103. The laser source 111 may provide the laser light to the emitter 103 through an optically transmissive media. The optically transmissive media may include an optical waveguide, an optical fiber, free-space transmission, or a combination of different transmissive media. The emitter 103 may emit the received laser light from the laser source 111 towards a target. The emitter 103 may be a device capable of emitting light towards a target. The emitter 103 may be a diffractive grating, a telescope, an optical fiber, or other component that can emit light towards a target.

In certain embodiments, the system 100 may include a multi-pixel receiver 105 that receives reflected laser light from the surface targeted by the emitter 103. The multi-pixel receiver 105 may have multiple pixels smaller than an expected optical speckle size, where the optical speckle size is a region on the multi-pixel receiver 105 where the optical field of the reflected laser light has substantially the same spatial phase. As used within this description, the spatial phase across a speckle is substantially the same when the spatial phase is substantially less than 180° maximum deviation across a pixel, such as less than 5° maximum deviation across a pixel, such that the laser light received through a single pixel would not destructively interfere when coupled into a single mode waveguide. In some implementations, the multi-pixel receiver 105 may include multiple diffractive grating receivers, where each diffractive grating functions as a different pixel of the multi-pixel receiver 105. Additionally, the multi-pixel receiver 105 may be a passive optical component. Thus, the operation of the multi-pixel receiver 105 does not change with time other than degradation.

In additional embodiments, the system 100 may include a combiner 107 coupled to the multi-pixel receiver 105. The combiner 107 may combine the optical fields or the light received through the separate pixels of the multi-pixel receiver 105 into a single optical path while substantially preserving the light received on the separate pixels. In particular, the combiner 107 may include multiple optical waveguide inputs, where each optical waveguide input couples to a separate pixel of the multi-pixel receiver 105. The combiner 107 may combine the optical waveguide inputs into a single output at a single junction, or the combiner 107 may progressively combine the optical waveguide inputs into a single output through multiple junctions. To support propagation of light along the optical path without loss from the path due to destructive interference of the modes corresponding to optical energy originating from different pixels, at each junction, the width of the waveguide may be made equal to the combined widths of the input waveguides. The combiner 107 combines the combined multiple optical waveguide inputs into a single output waveguide, without substantial loss of energy from the waveguides due to destructive interference of the optical fields originating from different pixels.

In some embodiments, the system 100 may include an integrated photonics chip 101 having multiple components formed therein. For example, the multi-pixel receiver 105 and the combiner 107 may be formed as part of the integrated photonics chip 101. Optionally, the emitter 103 may be formed as part of the integrated photonics chip 101 or formed as a separate physical component of the system 100.

In further embodiments, the system 100 may include a photodetector 109. The combiner 107 may couple the combined optical fields or optical light onto the photodetector 109. The photodetector 109 may receive the combined optical light, generate an electrical signal, and provide the electrical signal to a processor 113. The processor 113 processes the electrical signal to provide ranging information or other type of information acquirable from the reflected light.

In certain embodiments, the processor 113 and/or other computational devices used within the system 100 may be implemented using software, firmware, hardware, or an appropriate combination thereof. The processor 113 and other computational devices may be supplemented by, or incorporated in, specially-designed application-specific integrated circuits (ASICs) or field programmable gate arrays (FPGAs). The processing unit and other computational devices can also include or function with software programs, firmware, or other computer-readable instructions for carrying out various process tasks, calculations, and control functions used in the methods and systems described herein.

The methods described herein may be implemented or controlled by computer-executable instructions, such as program modules or components, which are executed by at least the processor 113 or other computing devices. Generally, program modules include routines, programs, objects, data components, data structures, algorithms, and the like, which perform particular tasks or implement particular abstract data types.

Instructions for carrying out the various process tasks, calculations, and generation of other data used in the operation of the methods described herein may be implemented in software, firmware, or other computer-readable instructions. These instructions are typically stored on appropriate computer program products that include computer-readable media used to store computer-readable instructions or data structures. Such a computer-readable medium may be available media that can be accessed by a general-purpose or special-purpose computer or processor, or any programmable logic device.

Suitable computer-readable storage media may include, for example, non-volatile memory devices including semiconductor memory devices such as Random Access Memory (RAM), Read Only Memory (ROM), Electrically Erasable Programmable ROM (EEPROM), or flash memory devices; magnetic disks such as internal hard disks or removable disks; optical storage devices such as compact discs (CDs), digital versatile discs (DVDs), Blu-ray discs; or any other media that can carry or store desired program code as computer-executable instructions or data structures.

Figure 2:
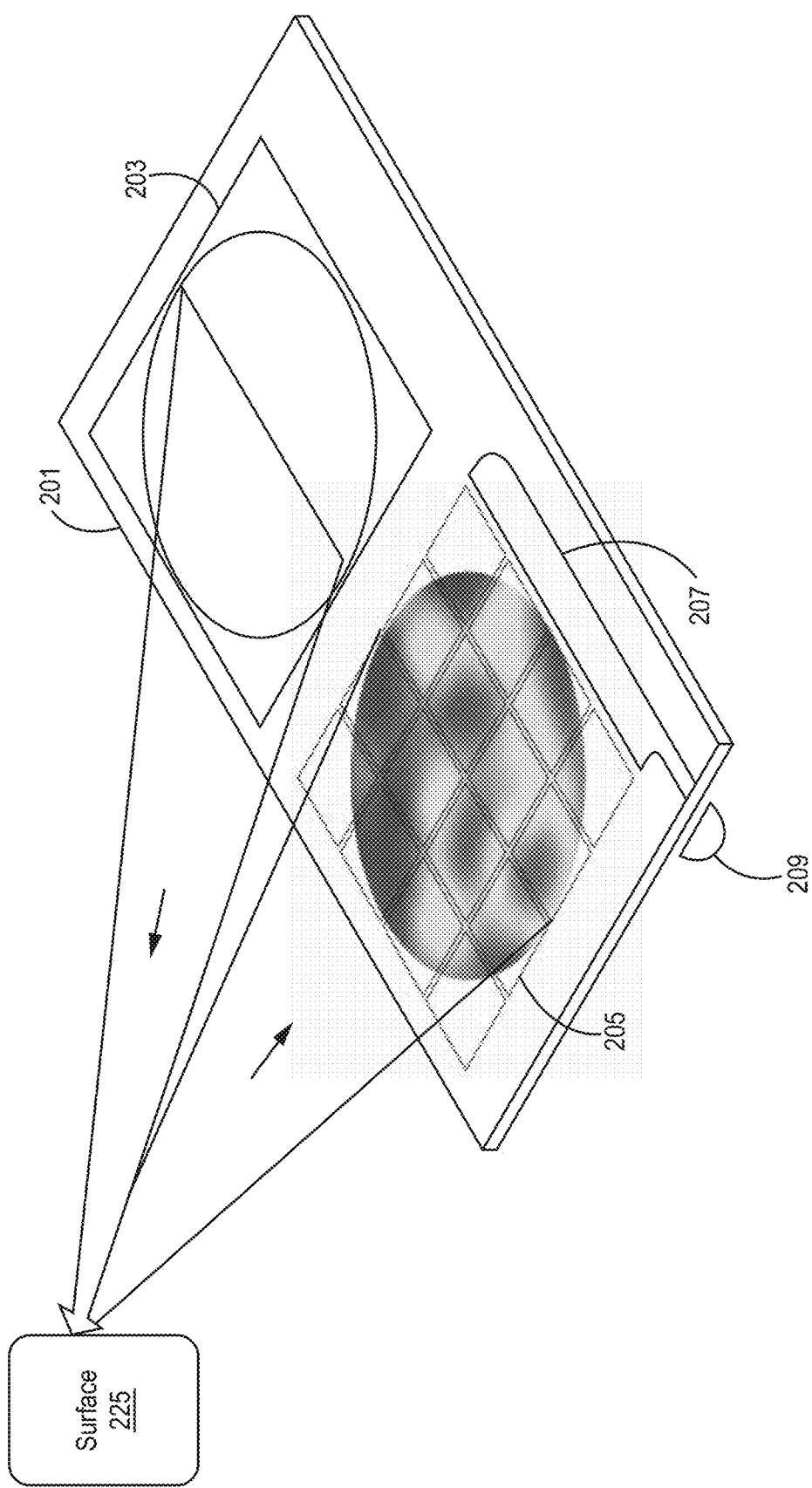
FIG. 2 is a diagram illustrating the operation of a multi-pixel waveguide optical receiver according to an aspect of the present disclosure.

FIG. 2 is a diagram illustrating the operation of a multi-pixel waveguide optical receiver. As illustrated, FIG. 2 illustrates exemplary components of the system 100 from FIG. 1, where the emitter 103, multi-pixel receiver 105, and the combiner 107 are formed on the same integrated photonics chip 101. For example, in FIG. 2, an integrated photonics chip 201 may have an emitter 203, multi-pixel receiver 205, and a combiner 207 formed thereon. The emitter 203, multi-pixel receiver 205, and combiner 207 may function as described above concerning the emitter 103, multi-pixel receiver 105, and combiner 107 in FIG. 1.

In exemplary embodiments, the emitter 203 may be a single-pixel diffraction grating emitter that emits provided light toward a surface 225. When the emitted light is incident on the surface 225, the surface 225 may diffusely scatter the light. Also, the surface 225 may be uneven and reflect light differently at different locations on the surface 225. When a portion of the light reflected off of the surface 225 is incident on the multi-pixel receiver 205, the spatial phase of the light incident on the multi-pixel receiver 205 may vary across the surface of the multi-pixel receiver 205.

In some embodiments, the pixel size is smaller than an expected optical speckle size of the light incident on the multi-pixel receiver 205. As shown, the multi-pixel receiver 205 may have 16 different pixels, and each pixel is a separate diffraction grating receiver, where the light received by a single pixel has substantially the same spatial phase. As the light has substantially the same spatial phase (within 180°), the light received by a single pixel may not substantially destructively interfere when transformed into a single optical mode, allowing the light received by the pixel to be subsequently transmitted to a photodetector 209 for detection without substantial loss of optical power from the optical power of the light originally incident on the pixel.

In certain embodiments, each pixel in the multi-pixel receiver 205 may couple light into a combiner 207 through a different optical path. The combiner 207 combines the different optical paths into a single optical path while facilitating the transmission of the different optical fields received at the different pixels of the multi-pixel receiver 205 to the photodetector 209. In some implementations, the multi-pixel receiver 205 combines the optical paths from multiple pixels at a single location. Alternatively, the multi-pixel receiver 205 may combine the optical paths from multiple pixels in a cascaded, or progressive fashion. When the combiner 207 has combined the light received through the different optical paths connected to the pixels into the single optical path, the combiner 207 may provide the combined light to a photodetector 209. The photodetector 209 may detect the light received from the multi-pixel receiver 205, where the combiner 207 combines the light while reducing destructive interference when providing the light to the photodetector 209.

Figure 3:
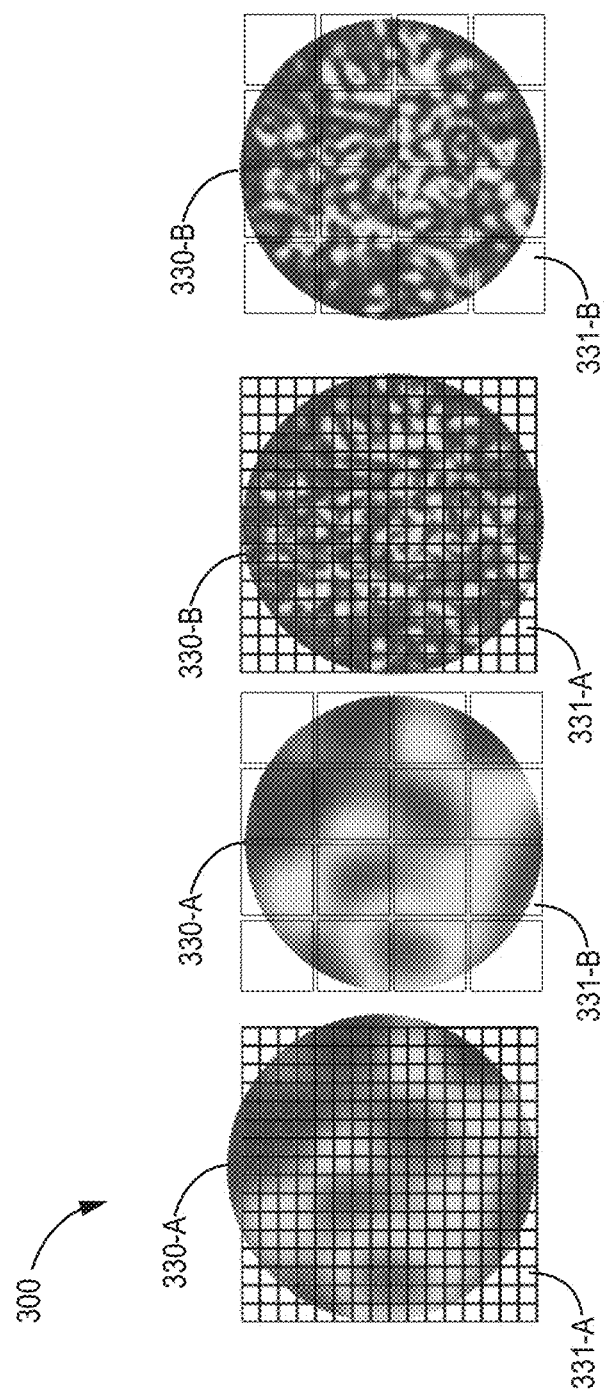
FIG. 3 is a diagram illustrating the association between optical speckle size and the size of pixels in a multi-pixel waveguide optical receiver according to an aspect of the present disclosure.

FIG. 3 illustrates several pixel arrangements 331-A-331-B of multi-pixel receivers and the relation of the pixel arrangements 331-A-331-B to incident light 330-A-330-B having different optical speckle sizes. As shown, the incident light 330-A may have large speckles or slower variation in spatial phase across the surface of the multi-pixel receiver. Conversely, the incident light 330-B may have small speckles or faster variation in spatial phase across the surface of the multi-pixel receiver. Also, the pixel arrangement 331-A may have small pixels, and the pixel arrangement 331-B may have large pixels.

As illustrated, when light of slowly-varying spatial phase 330-A is incident on the small-size pixel arrangement 331-A, the spatial phase across a single pixel is likely substantially uniform. Similarly, because of the slowly-varying spatial phase of the incident light 330-A, the spatial phase of the incident light across the pixels in the large-size pixel arrangement 331-B may also be substantially uniform. Because of the larger optical speckle size of the incident light 330-A, both arrangements 331-A and 331-B can facilitate light detection of the incident light without substantial destructive interference causing loss of optical power for the light combined in the connected combiner 207.

Further, when the rapidly-varying spatial phase incident light 330-B is incident on the small-size pixel arrangement 331-A, the pixel size may be smaller than the optical speckle size, and the spatial phase of the incident light across the pixels may be substantially uniform. Conversely, because of the rapid variation of the spatial phase of the incident light, the spatial phase of the incident light across the pixels in the large-size pixel arrangement 331-B may vary substantially across a single pixel, resulting in destructive interference causing loss of optical power for the light combined in the connected combiner 207.

In some embodiments, the pixel size of a multi-pixel receiver may be designed based on the expected optical speckle size of the light incident on the multi-pixel receiver. For example, when the expected optical speckle size is large, the multi-pixel receiver may have large sized pixels. Conversely, when the expected optical speckle size is small, the multi-pixel receiver may have small sized pixels. Factors that affect optical speckle size may include the expected surface that reflects light, the distance of the expected surface from the multi-pixel receiver, and other factors that potentially affect optical speckle size. As the number of pixels affects the complexity of the multi-pixel receiver and the combiner, a designer may determine the appropriate pixel size based on the operational environment of the system and other expected factors that affect optical speckle size.

Figure 4:
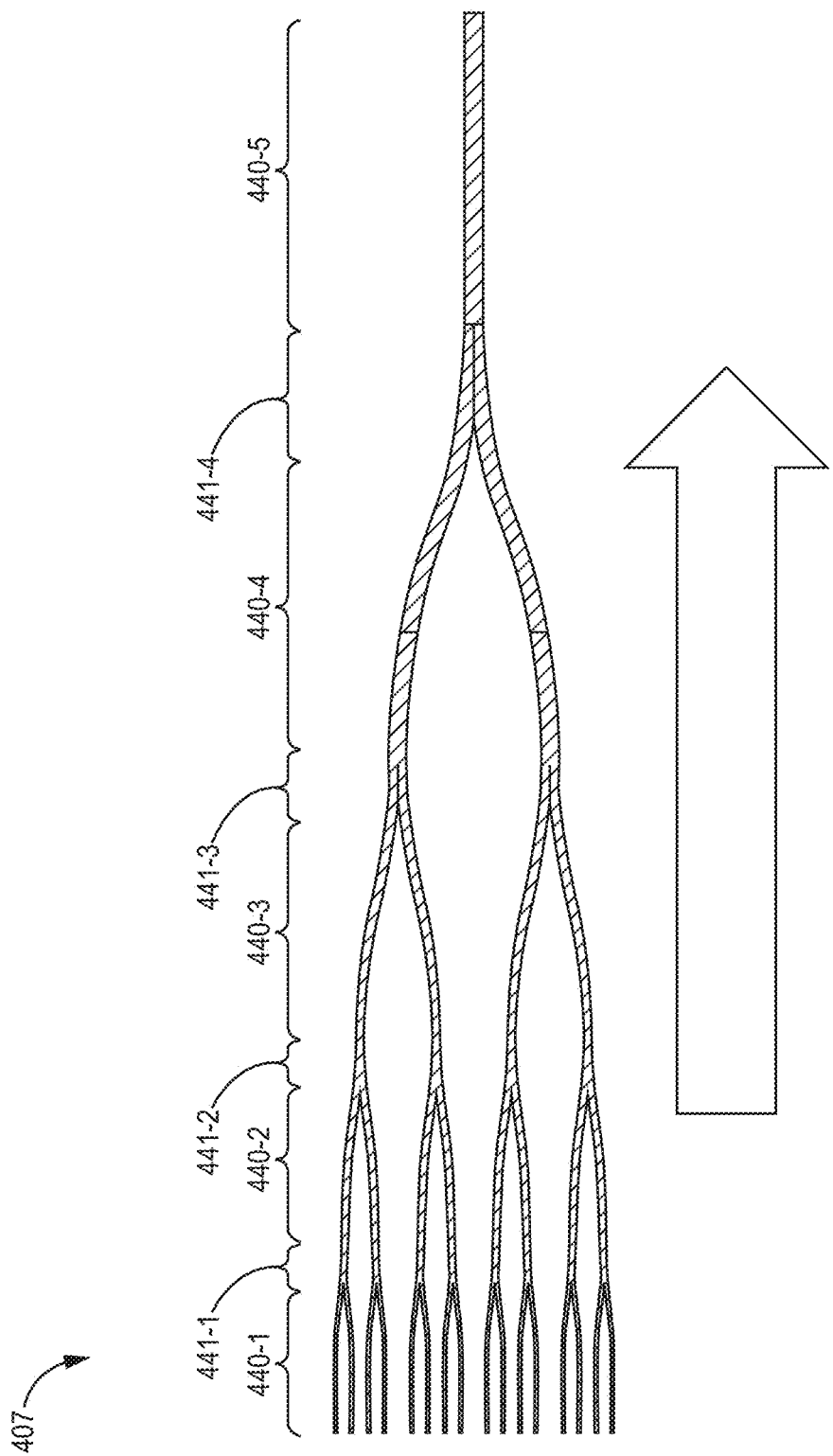
FIG. 4 is a diagram illustrating a waveguide combiner for combining light received through a multi-pixel waveguide optical receiver according to an aspect of the present disclosure.

FIG. 4 is a diagram illustrating a multistage combiner 407. As illustrated, the multistage combiner 407 may include multiple waveguide stages 440-1-440-5 that are connected through combiner stages 441-1-441-4. The multistage combiner 407 progressively combines waveguides from a single input for each pixel into a single output containing the light received through the pixels connected to the multistage combiner 407 while reducing destructive interference which can cause optical power to be scattered out of the waveguides when they combine.

In some embodiments, the first waveguide stage 440-1 of the multistage combiner 407 includes a separate waveguide for each pixel in the multi-pixel receiver. Each waveguide in the first waveguide stage 440-1 can support the propagation of a single mode. Accordingly, each waveguide in the first waveguide stage 440-1 supports the mode of the light received through the associated pixel of the multi-pixel receiver. The first combiner stage 441-1 includes multiple sub-combiners, where a sub-combiner is a combiner that combines a portion of the signals combined by the multistage combiner 407. Each sub-combiner in the first combiner stage 441-1 combines multiple stage input waveguides into a single stage output waveguide that supports the propagation of the different modes of the stage input waveguides.

In certain embodiments, each sub-combiner in the first combiner stage 441-1 may have two stage input waveguides that are combined into a single stage output waveguide, where the two stage input waveguides respectively allow a single mode to propagate. The two stage input waveguides may each have a width that supports the single propagating mode. A sub-combiner in the first combiner stage 441-1 couples the two stage input waveguides into a single stage output waveguide having a width that is twice the width of one of the stage input waveguides. As the stage output waveguide is twice the width of one of the stage input waveguides, the stage output waveguide supports twice as many modes, permitting the combined light to propagate in the waveguide without destructive interference causing optical power to scatter out of the waveguide. The stage output waveguides of the first combiner stage 441-1 function as the waveguides for a second waveguide stage 440-2.

As shown, the waveguides of the second waveguide stage 440-2 function as stage input waveguides for a second combiner stage 441-2. Similar to the first combiner stage 441-1, each sub-combiner in the second combiner stage 441-2 may have two stage input waveguides that are combined into a single stage output waveguide. However, in the second combiner stage 441-2, the two stage input waveguides may each have a width that supports two propagating modes. The second combiner stage 441-2 may couple the two stage input waveguides into a single stage output waveguide having a width that is twice the width of one of the stage input waveguides, or, stated differently, equal to the sum of the widths of the stage input waveguides. Accordingly, the width of the stage output waveguides of the second combiner stage 441-2 are four times the width of the waveguides in the first waveguide stage 440-1. The second combiner stage 441-2 provides the stage output waveguides as waveguides for the third waveguide stage 440-3.

The waveguides of the third waveguide stage 440-3 function as stage input waveguides for the third combiner stage 441-3, which combines the stage input waveguides into stage output waveguides in a similar manner as described above regarding the first combiner stage 441-1 and the second combiner stage 441-2. Accordingly, the widths of the stage output waveguides, provided as waveguides in the fourth waveguide stage 440-4, are equal to eight times the width of waveguides in the first waveguide stage 440-1. The waveguides of the fourth waveguide stage 440-4 function as stage input waveguides for the fourth combiner stage 441-4, which combines the stage input waveguides into a stage output waveguide 440-5 in a similar manner as described above regarding the other combiner stages 441-1-441-3. The width of the stage output waveguide 440-5 is equal to 16 times the width of the waveguides in the first waveguide stage 440-1 and can support all the propagating modes received through the first waveguide stage 440-1 while reducing destructive interference. The stage output waveguide 440-5 functions as the single output waveguide for the multistage combiner 407.

As illustrated, the multistage combiner 407 is presented as a binary tree, where each sub-combiner of the combiner stages 441-1-441-4 combines two stage input waveguides into a single stage output waveguide. However, the various combiner stages in the combiner can combine any number of stage input waveguides into a single stage output waveguide, where the width of the stage output waveguide is equal to the sum of the widths of the separate stage input waveguides. Also, sub-combiners within the different combiner stages of the multistage combiner 407 can combine different numbers of stage input waveguides.

Figure 5:
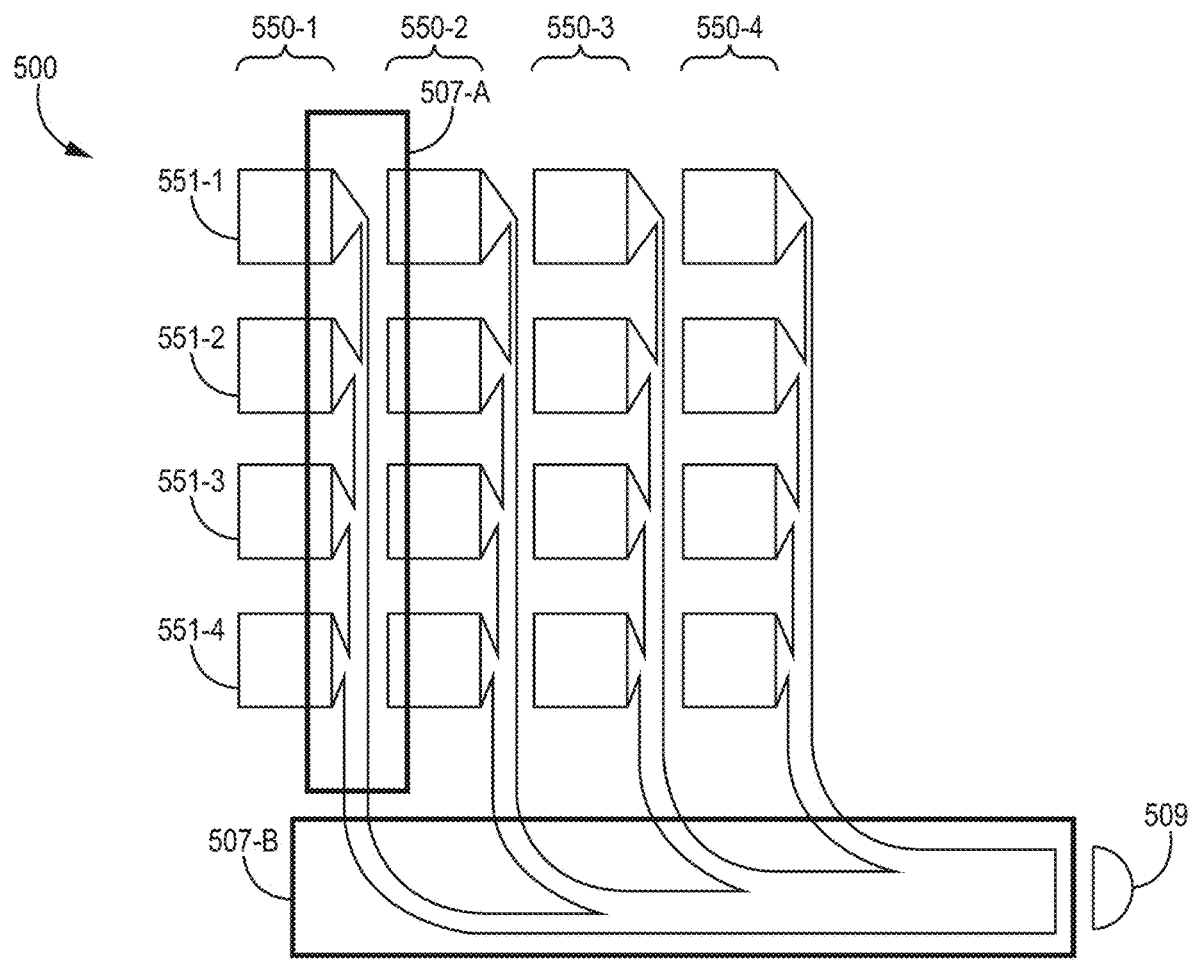
FIG. 5 is a diagram illustrating the combining of light received through a multi-pixel waveguide optical receiver according to an aspect of the present disclosure.

FIG. 5 is a diagram illustrating an exemplary embodiment of a combining system 500 for combining the pixels of a multi-pixel receiver. As shown, the pixels of the multi-pixel receiver are arranged into different groups, where the groups are represented as columns 550-1-550-4. The combining system 500 incrementally couples the light received through the pixels for each column 550 into a group output waveguide. After incrementally combining the light received through the pixels for each column 550, the combining system 500 then incrementally couples the light in the separate group output waveguides into a single output waveguide, where the light in the single output waveguide is coupled onto a photodetector 509, where the photodetector 509 functions in a similar manner as the photodetector 109 in FIG. 1.

As shown, each column has a group combiner 507-A. The group combiner 507-A may be a waveguide that runs the length of a column or other group configuration, where a waveguide from each pixel in the column couples into the group combiner 507-A. As shown, the column 550-1 may include pixels 551-1-551-4. The beginning of the group combiner 507-A is coupled to the first pixel 551-1. The group combiner 507-A then extends along the length of the column to the second pixel 551-2. Light from the second pixel 551-2 is coupled into the group combiner 507-A. To support the propagation of the modes of the light received through the first pixel 551-1 and the second pixel 551-2, the width of the group combiner 507-A is increased, where the second pixel 551-2 couples to the group combiner 507-A. In certain embodiments, the width of the column combiner 507-A is doubled or increased by the width associated with the propagation of a single mode. Additionally, when light is coupled from the third pixel 551-3 and the fourth pixel 551-4 into the group combiner 507-A, the group combiner 507-A is respectively increased by the width associated with the propagation of a single mode. Thus, after the third pixel 551-3 is coupled to the group combiner 507-A, the width of the column combiner 507-A is three times the width of the initial waveguide coupled to the first pixel 551-1. Similarly, after the fourth pixel 551-4 is coupled to the group combiner 507-A, the width of the column combiner 507-A is four times the width of the initial waveguide coupled to the first pixel 551-1.

As discussed above, the width of the group combiner 507-A after combining the inputs of the pixels in the column may be equal to the number of pixels coupled to the group combiner 507-A multiplied by the width of a waveguide that supports the propagation of a single mode. The combining system combines all the columns 550-1-550-4 as described above concerning the group combiner 507-A. Thus, each column combiner provides a waveguide having a width proportional to the number of pixels combined in the column. In some embodiments, each column has the same number of pixels. Alternatively, the columns may have different numbers of pixels. When the number of pixels is different, the waveguides provided by the separate column combiners may have different widths.

In certain embodiments, an output combiner 507-B combines the waveguides provided by the separate column combiners into a single output waveguide, where the single output waveguide has a width equal to the combined widths of the waveguides provided by the separate column combiners. For example, the output combiner 507-B may combine the waveguide provided by the column combiner associated with the first column 550-1 with the waveguide provided by the column combiner associated with the second column 550-2. The output combiner then progressively combines the waveguides provided by the column combiner associated with the third column 550-3 and the column combiner associated with the fourth column 550-4. As each waveguide is combined, the width of the combined waveguide is increased to equal the sum of the waveguides being combined.

In exemplary embodiments, the output of the output combiner 507-B is incident on the photodetector 509. As the output contains the light received through the multiple pixels, where the light is combined to limit destructive interference, the light incident on the photodetector 509 may account for a substantial fraction of the sum of the optical power received by the multiple pixels.

Figure 6:
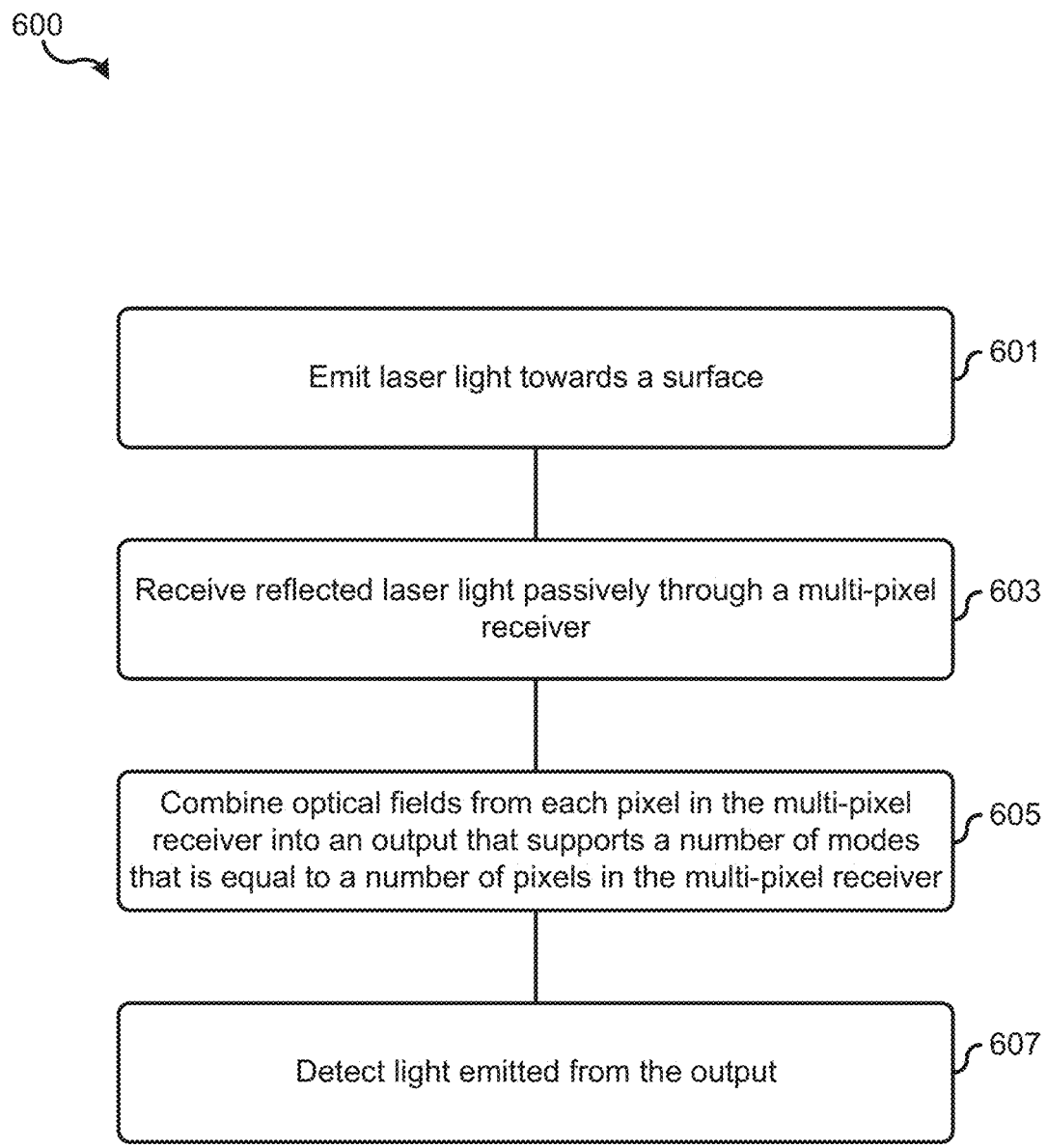
FIG. 6 is a flowchart diagram of a method for operating a lidar system having a multi-pixel waveguide optical receiver according to an aspect of the present disclosure.

FIG. 6 is a flowchart diagram of a method 600 for operating a lidar system having a multi-pixel waveguide optical receiver. The method 600 proceeds at 601, where laser light is emitted towards a surface. Also, the method 600 proceeds at 603, where reflected laser light is passively received through a multi-pixel receiver. Further, the method 600 proceeds at 605, where optical fields from each pixel in the multi-pixel receiver are combined into an output that supports a number of modes that is equal to a number of pixels in the multi-pixel receiver. Additionally, the method 600 proceeds at 607, where light emitted from the output is detected.

EXAMPLE EMBODIMENTS

Example 1 includes a system comprising: an emitter that emits laser light towards a surface; a receiver that passively receives reflected laser light that is a portion of the laser light reflected from the surface, wherein the receiver has multiple pixels having a size that is smaller than an expected optical speckle size, wherein the expected optical speckle size corresponds to a region on the receiver where the reflected laser light has a substantially uniform spatial phase; a combiner configured to combine optical fields from each pixel in the multiple pixels into an output that supports a number of modes that is equal to a number of pixels in the multiple pixels; and a photodetector configured to receive light from the output.

Example 2 includes the system of Example 1, wherein the emitter is a diffraction grating emitter, the receiver is a diffraction grating receiver, and the emitter and the receiver are formed on an integrated photonics chip.

Example 3 includes the system of any of Examples 1-2, wherein the combiner is coupled to individual pixels in the multiple pixels with separate input waveguides and combines the separate input waveguides into a single output waveguide.

Example 4 includes the system of Example 3, wherein the combiner comprises a plurality of combiner stages, wherein each combiner stage comprises one or more sub-combiners, a plurality of stage input waveguides, and one or more stage output waveguides, wherein: when the plurality of stage input waveguides are the separate input waveguides, a sub-combiner in the one or more sub-combiners combines a plurality of separate input waveguides into a stage output waveguide in the one or more stage output waveguides; when a single stage output waveguide in the one or more stage output waveguides is the single output waveguide, the sub-combiner combines the plurality of stage input waveguides into the single output waveguide; and when the plurality of stage input waveguides are received from other combiner stages and the one or more stage output waveguides are provided to the other combiner stages, the sub-combiner combines the plurality of stage input waveguides into the stage output waveguide in the one or more stage output waveguides.

Example 5 includes the system of Example 4, wherein the sub-combiner combines two stage input waveguides into the stage output waveguide.

Example 6 includes the system of any of Examples 4-5, wherein the sub-combiner combines three or more input waveguides into the stage output waveguide.

Example 7 includes the system of any of Examples 3-6, wherein a width of the single output waveguide is equal to a combined width of the separate input waveguides.

Example 8 includes the system of any of Examples 3-7, wherein the multiple pixels are arranged in groups and the combiner comprises: a group combiner that incrementally combines the separate input waveguides of the groups into separate group output waveguides associated with each group; and an output combiner that incrementally combines the separate group output waveguides into the single output waveguide.

Example 9 includes the system of any of Examples 1-8, further comprising: one or more processors that receive an electrical signal generated by the photodetector in response to the light received from the output.

Example 10 includes a method comprising: emitting laser light towards a surface; receiving reflected laser light passively through a multi-pixel receiver, wherein the reflected laser light is a portion of the laser light reflected from the surface, wherein a size of pixels in the multi-pixel receiver are smaller than an expected optical speckle size, wherein the expected optical speckle size corresponds to a region on the multi-pixel receiver where the reflected laser light has a substantially uniform spatial phase; combining optical fields from each pixel in the multi-pixel receiver into an output that supports a number of modes that is equal to a number of pixels in the multi-pixel receiver; and detecting light emitted from the output.

Example 11 includes the method of Example 10, wherein a diffraction grating emitter emits the laser light and a diffraction grating receiver receives the reflected laser light, wherein the diffraction grating emitter and the diffraction grating receiver are formed on an integrated photonics chip.

Example 12 includes the method of any of Examples 10-11, wherein combining the optical fields further comprises: coupling individual pixels in the multi-pixel receiver with separate input waveguides; and combining the separate input waveguides into a single output waveguide.

Example 13 includes the method of Example 12, wherein combining the separate input waveguides into the single output waveguide further comprises using a plurality of combiner stages, wherein each combiner stage comprises a plurality of stage input waveguides and one or more stage output waveguides, wherein: when the plurality of stage input waveguides are the separate input waveguides, combining a plurality of separate input waveguides into a stage output waveguide in the one or more stage output waveguides; when the stage output waveguide is the single output waveguide, combining the plurality of stage input waveguides into the single output waveguide; and when the plurality of stage input waveguides are received from other combiner stages and the one or more stage output waveguides are received from the other combiner stages, combining the plurality of stage input waveguides into the stage output waveguide in the one or more stage output waveguides.

Example 14 includes the method of Example 13, wherein using the plurality of combiner stages further comprises combining two stage input waveguides into the stage output waveguide.

Example 15 includes the method of any of Examples 13-14, wherein using the plurality of combiner stages further comprises combining three or more stage input waveguides into the stage output waveguide.

Example 16 includes the method of any of Examples 12-15, wherein a width of the single output waveguide is equal to a combined width of the separate input waveguides.

Example 17 includes the method of any of Examples 12-16, wherein the pixels in the multi-pixel receiver are arranged in groups and combining the separate input waveguides into the single output waveguide further comprises: incrementally combining the separate input waveguides of the groups into separate group output waveguides associated with each group; and incrementally combining the separate group output waveguides into the single output waveguide.

Example 18 includes the method of any of Examples 10-17, wherein detecting the light emitted from the output further comprises: providing an electrical signal based on detecting the light.

Example 19 includes a system comprising: a receiver that passively receives reflected laser light from a surface, wherein the receiver has multiple pixels sized to correspond to a region on the receiver expected to have a substantially uniform spatial phase; a combiner configured to combine optical fields from each pixel in the multiple pixels into an output that supports a number of modes that is equal to a number of pixels in the multiple pixels; and a photodetector configured to receive light from the output.

Example 20 includes the system of Example 19, wherein the combiner is coupled to individual pixels in the multiple pixels with separate input waveguides and combines the separate input waveguides into a single output waveguide.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A system comprising:
   an emitter that emits laser light towards a surface;
   a receiver that passively receives reflected laser light that is a portion of the laser light reflected from the surface, wherein the receiver has multiple pixels having a size that is smaller than an expected optical speckle size, wherein the expected optical speckle size corresponds to a region on the receiver where the reflected laser light has a substantially uniform spatial phase, wherein the emitter is a diffraction grating emitter, the receiver is a diffraction grating receiver, and the emitter and the receiver are formed on an integrated photonics chip;
   a combiner configured to combine optical fields from each pixel in the multiple pixels into an output that supports a number of modes that is equal to a number of pixels in the multiple pixels; and
   a photodetector configured to receive light from the output.

2. The system of claim 1, wherein the combiner is coupled to individual pixels in the multiple pixels with separate input waveguides and combines the separate input waveguides into a single output waveguide.

3. The system of claim 2, wherein the combiner comprises a plurality of combiner stages, wherein each combiner stage comprises one or more sub-combiners, a plurality of stage input waveguides, and one or more stage output waveguides, wherein:
   when the plurality of stage input waveguides are the separate input waveguides, a sub-combiner in the one or more sub-combiners combines a plurality of separate input waveguides into a stage output waveguide in the one or more stage output waveguides;
   when a single stage output waveguide in the one or more stage output waveguides is the single output waveguide, the sub-combiner combines the plurality of stage input waveguides into the single output waveguide; and
   when the plurality of stage input waveguides are received from other combiner stages and the one or more stage output waveguides are provided to the other combiner stages, the sub-combiner combines the plurality of stage input waveguides into the stage output waveguide in the one or more stage output waveguides.

4. The system of claim 3, wherein the sub-combiner combines two stage input waveguides into the stage output waveguide.

5. The system of claim 3, wherein the sub-combiner combines three or more input waveguides into the stage output waveguide.

6. The system of claim 2, wherein a width of the single output waveguide is equal to a combined width of the separate input waveguides.

7. The system of claim 2, wherein the multiple pixels are arranged in groups and the combiner comprises:
   a group combiner that incrementally combines the separate input waveguides of the groups into separate group output waveguides associated with each group; and
   an output combiner that incrementally combines the separate group output waveguides into the single output waveguide.

8. The system of claim 1, further comprising:
   one or more processors that receive an electrical signal generated by the photodetector in response to the light received from the output.

9. A method comprising:
   emitting laser light towards a surface;
   receiving reflected laser light passively through a multi-pixel receiver, wherein the reflected laser light is a portion of the laser light reflected from the surface, wherein a size of pixels in the multi-pixel receiver are smaller than an expected optical speckle size, wherein the expected optical speckle size corresponds to a region on the multi-pixel receiver where the reflected laser light has a substantially uniform spatial phase, wherein a diffraction grating emitter emits the laser light and a diffraction grating receiver receives the reflected laser light, wherein the diffraction grating emitter and the diffraction grating receiver are formed on an integrated photonics chip;
   combining optical fields from each pixel in the multi-pixel receiver into an output that supports a number of modes that is equal to a number of pixels in the multi-pixel receiver; and
   detecting light emitted from the output.

10. The method of claim 9, wherein combining the optical fields further comprises:
    coupling individual pixels in the multi-pixel receiver with separate input waveguides; and
    combining the separate input waveguides into a single output waveguide.

11. The method of claim 10, wherein combining the separate input waveguides into the single output waveguide further comprises using a plurality of combiner stages, wherein each combiner stage comprises a plurality of stage input waveguides and one or more stage output waveguides, wherein:
    when the plurality of stage input waveguides are the separate input waveguides, combining a plurality of separate input waveguides into a stage output waveguide in the one or more stage output waveguides;
    when the stage output waveguide is the single output waveguide, combining the plurality of stage input waveguides into the single output waveguide; and
    when the plurality of stage input waveguides are received from other combiner stages and the one or more stage output waveguides are received from the other combiner stages, combining the plurality of stage input waveguides into the stage output waveguide in the one or more stage output waveguides.

12. The method of claim 11, wherein using the plurality of combiner stages further comprises combining two stage input waveguides into the stage output waveguide.

13. The method of claim 11, wherein using the plurality of combiner stages further comprises combining three or more stage input waveguides into the stage output waveguide.

14. The method of claim 10, wherein a width of the single output waveguide is equal to a combined width of the separate input waveguides.

15. The method of claim 10, wherein the pixels in the multi-pixel receiver are arranged in groups and combining the separate input waveguides into the single output waveguide further comprises:
   incrementally combining the separate input waveguides of the groups into separate group output waveguides associated with each group; and
   incrementally combining the separate group output waveguides into the single output waveguide.

16. The method of claim 9, wherein detecting the light emitted from the output further comprises:
   providing an electrical signal based on detecting the light.

* * * * *